United States Patent [19]

Kawakatsu

[11] Patent Number: 4,582,565

[45] Date of Patent: Apr. 15, 1986

[54] METHOD OF MANUFACTURING INTEGRATED SEMICONDUCTOR CIRCUIT DEVICES

[75] Inventor: Akira Kawakatsu, Tokyo, Japan

[73] Assignee: Oki Electric Company Industry, Ltd., Tokyo, Japan

[21] Appl. No.: 638,942

[22] Filed: Aug. 8, 1984

[30] Foreign Application Priority Data

Aug. 15, 1983 [JP] Japan .................. 58-148057

[51] Int. Cl.$^4$ .............. H01L 21/306; B44C 1/22; C03C 15/00; C03C 25/06
[52] U.S. Cl. ................ 156/643; 29/576 W; 29/580; 148/175; 148/187; 156/646; 156/648; 156/649; 156/653; 156/657; 156/659.1; 156/662; 357/47; 357/59; 427/93
[58] Field of Search ........... 156/643, 646, 647–649, 156/653, 657, 659.1, 661.1, 662; 29/576 W, 580; 430/313, 317; 148/175, 187; 427/85, 93, 86; 357/47–50, 59

[56] References Cited

U.S. PATENT DOCUMENTS

| | | | |
|---|---|---|---|
| 4,333,227 | 6/1982 | Horng et al. | 29/580 |
| 4,473,598 | 9/1984 | Ephrath et al. | 427/86 |
| 4,493,740 | 1/1985 | Komeda | 148/187 |

*Primary Examiner*—William A. Powell
*Attorney, Agent, or Firm*—Frishauf & Partners

[57] ABSTRACT

A method of fabricating integrated semiconductor circuit devices with improved surface planarity. An oxidation-resistant masking layer is deposited over the surface of a semiconductor body and the walls of vertical trenches of a given width formed in the semiconductor body surface. The masking layer is removed in part from predetermined portions of the semiconductor body surface. A polycrystalline semiconductor material is deposited over the semiconductor body surface to bury the trenches, followed by continuous partial removal of the polycrystalline semiconductor material and the semiconductor body at portions corresponding to the predetermined portions of the semiconductor body surface to a predetermined surface level lower than the semiconductor body surface. The remainder of each of the polycrystalline semiconductor material and the above corresponding portions of the semiconductor body is thermally oxidized to present substantially the same surface level with the semiconductor body surface, whereby the semiconductor body has a flat surface. Preferably, a second oxidation-resistant masking layer is deposited over the partly removed semiconductor body along its whole surface including predetermined lower surface portions thereof in a manner superimposed upon the first-mentioned masking layer. The second masking layer is removed at portions on a predetermined level lower than the semiconductor body surface. Also portions of the semiconductor body from which the second masking layer has been removed are thermally oxidized during the above oxidation step, to further enhance the surface planarity of the semiconductor body.

16 Claims, 14 Drawing Figures

METHOD OF MANUFACTURING INTEGRATED SEMICONDUCTOR CIRCUIT DEVICES

BACKGROUND OF THE INVENTION

This invention relates to dielectric isolation for integrated semiconductor devices, and more particularly to a method of manufacturing integrated semiconductor circuit devices, which is adapted to simultaneously form narrow isolation regions and wide field regions, with high surface planarity, by means of simple steps.

In bipolar type integrated semiconductor circuit devices, the active elements are generally isolated by the PN junction isolation. However, with increasing demand for smaller device sizes and higher packing density, it has become necessary to reduce the isolation areas. The PN junction isolation has been gradually superseded by the oxide isolation (the so-called Isoplanar Process) using thick oxide formed in the silicon substrate through local oxidation.

The oxide isolation method typically comprises placing on a silicon substrate an oxidation-resistant masking layer formed of a composite layer of a thin silicon oxide film and a silicon nitride film, etching the surface of the silicon substrate to form mesa regions for active elements under the masking layers, and thermally oxidizing the silicon substrate to form thick silicon oxide as field isolation regions surrounding the mesa regions. According to this method, the thermally grown thick oxide has increased volume to present surfaces nearly flush with the surfaces of the device regions.

As compared with the PN junction, the oxide isolation can reduce the widths and areas of the isolation regions, and can also reduce stray capacitances between the surface conductors and the substrate due to the thick silicon oxide forming all regions other than the device regions (hereinafter called "the field region(s)"), thereby contributing to increase of the switching speed of the resulting transistors.

However, during the above thermal oxidation step, since lateral oxidation causes formation of "bird's beak" and "bird's head" between the silicon substrate and the oxidation-resistance masking layer, the widths of the isolation regions become greater than an allowable minimum dimension obtained by the conventional photolithography, which is approximately 10 microns. Also, the bird's beak and bird's head spoils the perfect planarity of the substrate surface.

To overcome such disadvantages, an improved isolation technique has been proposed as represented, e.g. by a process described in a paper entitled "A Method for Area Saving Planar Isolation Oxidation Protected Sidewalls" by D. Kahng et al, published in Solid-State Science And Technology issued by J. Electrochemistry Society, Vol. 127, No. 11, November, 1980, pp. 2468-2470. According to this process (hereinafter referred to as "Improved Local Oxidation Process"), in addition to a first oxidation-resistant layer of silicon nitride deposited over the top surfaces of mesa regions, a second oxidation-resistant layer of silicon nitride is deposited, by chemical vapor deposition, on the sidewalls of the mesa regions. The improved Local Oxidation Process can thus prevent widening of the isolation regions caused by the lateral oxidation, and formation of bird's beak and bird's head and can achieve flattening of the silicon substrate surface irrespective of the width of the isolation regions to be formed, by simple steps.

However, according to this process, it takes an impracticably very long time to form thick field regions by oxidizing through an epitaxial layer on the surface of the silicon substrate. To shorten the oxidizing time, buried regions have to be formed in the surface of a silicon substrate by using a mask before the formation of an epitaxial layer on the entire surface of the silicon substrate, and then mesa regions are formed by selectively etching the epitaxial layer with a second mask. Therefore, more critical mask aligning tolerances are required in aligning the second mask with the formerly formed buried region. Furthermore, in the case of narrow isolation regions, a P+ channel stop layer formed under the bottom of the isolation region can spread to the nearby N buried region, resulting in increased parasitic capacitance, increased leak current between the base region and the P+ channel stop layer and reduced breakdown voltage.

Recently, a trench isolation technique has been developed, which utilizes a reactive ion etching (RIE) process capable of etching a silicon substrate vertically to the substrate surface to form grooves of a given width having vertical sidewalls. The trench isolation technique is represented, e.g. by a process described in a paper entitled "U-Groove Isolation Technique For High Speed Bipolar VLS's" by Akio Hayasaka et al, published in IEDM 82, 1982, pp. 62-65. According to this process, a silicon substrate is etched using RIE to form deep, shear U-grooves. The grooves or trenches are oxidized to form a dielectric material such as silicon dioxide along their walls, and covered with a dielectric film such as silicon nitride. A polycrystalline semiconductor material is then deposited over the silicon substrate so as to bury the grooves, and then etched back to form a flat surface on the silicon substrate. This process will hereinafter be referred to as "Trench Isolation Process".

In fabricating bipolar integrated circuit devices by means of the Trench Isolation Process, deep isolation grooves can be formed in the silicon substrate so as to penetrate a buried layer formed by diffusion throughout the whole area of the silicon substrate, thereby dispensing with the use of a mask for formation of such buried layer, which has conventionally been employed. However, according to the Trench Isolation Process, it is difficult to simultaneously form a flat surface over small width isolation regions and large width field regions. That is, a separate flattening step using a mask is required to obtain required surface planarity, which leads to an increased number of fabricating steps, and also requires a special mask aligning step because of the tight mask aligning tolerances.

In fabricating bipolar integrated circuit devices, it is desirable to divide a portion of the transistor-forming region in the vicinity of the substrate surface into base and collector contact regions so as to have the buried layer in common with each other, that is, to have the buried layer underlaying both the two regions, in order to assure a high switching speed of the transistor. To this end, it is necessary to form deep trenches for separating device areas of integrated transistor devices and shallow trenches for separating base and collector contact regions in an array satisfying the above dividing requirements, and two masks have to be provided for forming respective deep and shallow trenches. These requirements cause complication of the fabricating steps.

SUMMARY OF THE INVENTION

It is therefore an object of the invention to provide a method of fabricating integrated semiconductor circuit devices, which is capable of fabricating such circuit devices having a flat surface with narrow isolation regions, by simple steps without requiring tight mask aligning tolerances.

It is a further object of the invention to provide a method of fabricating integrated semiconductor circuit devices, which can produce such circuit devices in a manner reducing the parasitic capacitance between the surface conductors and the substrate as well as the junction capacitance between the buried regions and the P channel stop region.

Throughout the present specification, the terms "grooves" and "trenches" are used interchangeably.

The present invention provides a method of forming a structure adapted for formation of integrated circuit devices on a semiconductor body. A plurality of trenches of a given width are formed in one surface of the semiconductor body and extend substantially vertically with respect to the one surface. An oxidation-resistant masking layer is deposited over the one surface of the semiconductor body and the walls of the trenches. The oxidation-resistant masking layer is removed at portions corresponding to predetermined portions of the one surface of the semiconductor body. A polycrystalline semiconductor material is deposited over the one surface of the semiconductor body to bury the trenches. Continuously removed in part are the polycrystalline semiconductor material and portions of the semiconductor body corresponding to the above predetermined portions of the one surface, from which the above portions of the oxidation-resistant masking layer have been removed, until the polycrystalline semiconductor material and the semiconductor body have a predetermined surface level lower than the semiconductor body surface. The remainder of the polycrystalline semiconductor material and the remainder of the portions of the semiconductor body corresponding to the predetermined portions of the one surface thereof are oxidized at least in part to increase in volume until they have substantially the same surface level with the one surface of the semiconductor body. Thus, the oxidized polycrystalline semiconductor material and semiconductor body present a flat surface.

To remove the aforesaid corresponding portions of the oxidation-resistant masking layer, a photoresist is deposited over the one surface of the semiconductor body to bury the trenches. Selected portions of the photoresist are exposed to light in such a manner that portions of the photoresist on the above predetermined portions of the semiconductor body surface are removed by development, whereas portions of the photoresist within the trenches remain unremoved even by the development. The exposed selected portions of the photoresist are removed. The aforesaid corresponding portions of the oxidation-resistant masking layer are removed by etching.

Preferably, after the above-mentioned partial removal of the polycrystalline semiconductor material and the semiconductor body, a second oxidation-resistant masking layer is deposited over the semiconductor body along the one surface thereof and predetermined surface portions thereof lower in level than the one surface in a manner superimposed upon the first-mentioned oxidation-resistant masking layer. Portions of the second masking layer on a predetermined level lower than the one surface of the semiconductor body are removed. Then, the remainder of the polycrystalline semiconductor material and the remainder of portions of the semiconductor body corresponding to the predetermined portions of the one surface and the above predetermined lower surface portions, from which the first-mentioned and second masking layers have been removed, are oxidized at least in part to increase in volume until they have substantially the same surface level with the one surface of the semiconductor body. Thus, the oxidized polycrystalline semiconductor material and semiconductor body present a flat surface with further enhanced planarity.

The above and other objects, features and advantages of the invention will be more apparent from the ensuing detailed description taken in conjunction with the accompanying drawings.

DETAILED DESCRIPTION

The method of the invention will now be described in detail with reference to the drawings showing preferred embodiments thereof which are applied to bipolar type integrated semiconductor circuit devices.

Figure 1A:
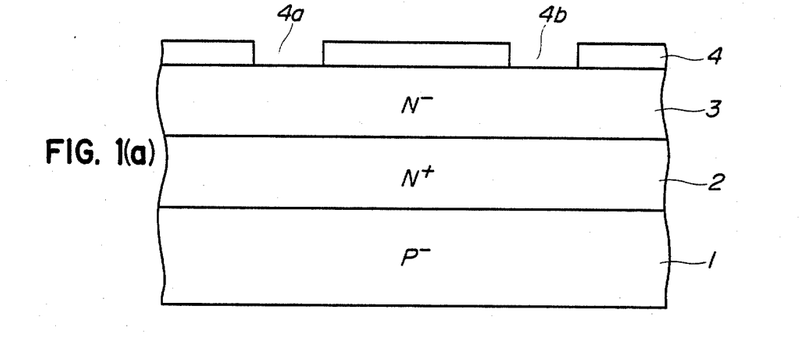
FIG. 1(a)–FIG. 1(g) are schematic sectional views of a semiconductor body in different steps according to a first embodiment of the method of the invention.

Referring first to FIG. 1(a)–FIG. 1(g), a first embodiment of the method of the invention is shown. In the step of FIG. 1(a), an N+ buried layer 2 is formed through diffusion over the whole surface of a P− silicon substrate 1, and an N− epitaxial layer 3 on the N+ buried layer 2, respectively, in a conventional manner. Preferably, the P− silicon substrate 1 should have an impurity concentration of approximately $10^{15}$ cm$^{-3}$, the N+ buried layer 2 should have a depth of diffusion of from 1 to 3 microns from the substrate surface and a sheet resistivity of from 10 to 40 ohms/□, and the N− epitaxial layer 3 an impurity concentration of approximately $10^{16}$ cm$^{-3}$ and a thickness of from 1 to 3 microns.

The silicon subtrate 1, the N+ buried layer 2, and the N− epitaxial layer 3 will be hereinafter generically called "the silicon body".

A photoresist 4 is applied over the surface of the silicon body, exposed to light through an apertured photomask, not shown, and subjected to development so that trench-forming openings 4a, 4b are formed in the surface at predetermined locations [FIG. 1(a)].

Figure 1B:
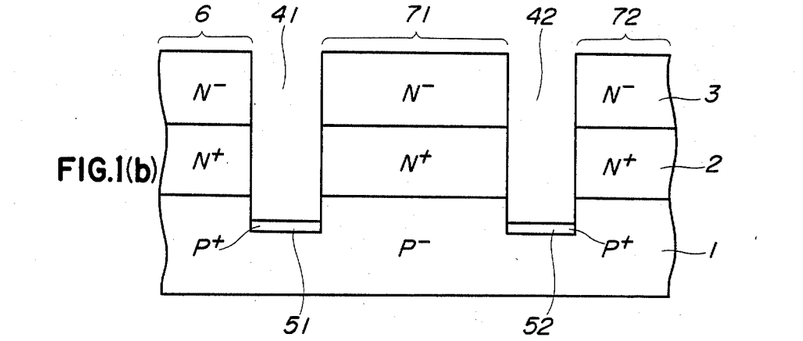

Then, as shown in FIG. 1(b), by photolithography utilizing the RIE technique, trenches 41 and 42 are formed in the silicon body surface at locations right under the respective openings 4a, 4b, which have the same width and extend through the epitaxial layer 3 and also through the buried layer 2 into the silicon substrate 1 along a line vertical to the surface of the silicon body. P+ layers 51 and 52 as channel stoppers are formed under the bottoms of the respective trenches 41, 42 in a self-aligned manner by boron (B) ion implantation in a dose amount of from $10^{13}$ to $10^{14}$ cm$^{-2}$. Then, the photoresist is removed by solvent.

The trenches 41, 42 thus formed in the step of FIG. 1(b) define three regions within the silicon body, i.e., a field region 6 on the left side of the trench 41, an element-forming region 71 between the trenches 41, 42, and an element-forming region 72 on the right side of the trench 42, wherein the trench 42 is intended as a narrow device-isolation region, and the trench 41 and the field region 6 is intended as a wide device-isolation region.

Figure 1C:
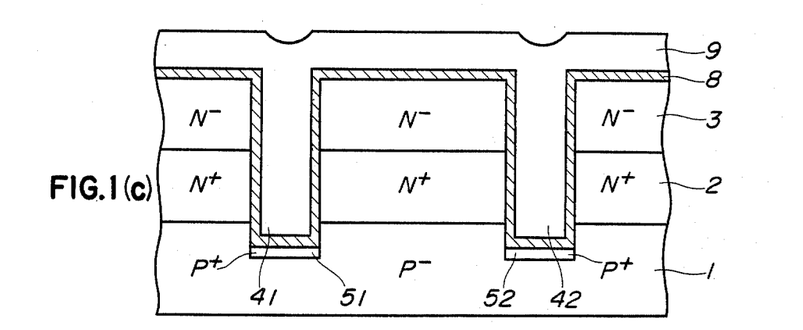

Then, an oxidation-resistant masking layer 8 is formed over the whole surface of the silicon body including the walls of the trenches 41, 42, as shown in FIG. 1(c). The oxidation-resistant masking layer 8 may preferably be a three-ply layer formed of a silicon oxide film of a thickness of from 200 to 1000 Angstroms formed by thermal oxidation, and a silicon nitride film of a thickness of from 500 to 2000 Angstroms and a silicon oxide film of a thickness of from 1000 to 3000 Angstroms, which are successively formed on the silicon oxide film by chemical vapor deposition (CVD).

A positive-type photoresist 9 is applied over the masking layer 8 to bury the trenches 41, 42 as shown in FIG. 1(c).

Figure 1D:
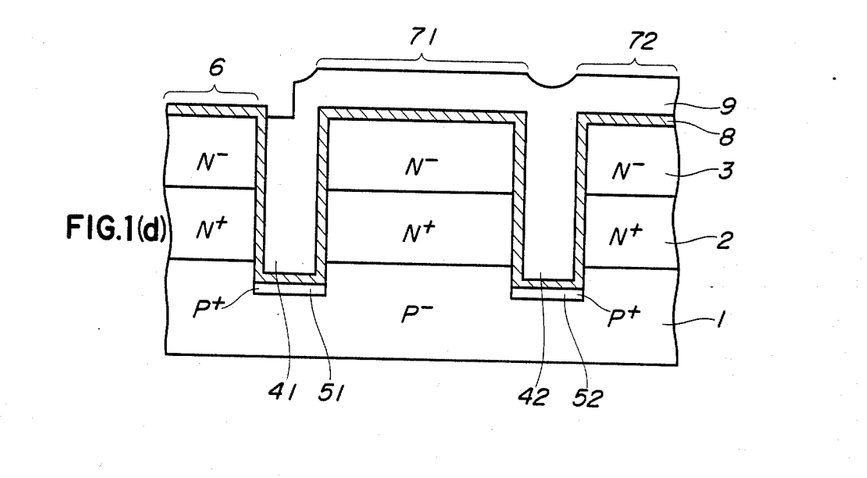

Next, a photomask, not shown, is placed over the surface of the photoresist 9 so as to cover the resist 9 at locations corresponding to the device-forming regions 71, 72 and the isolation trenches 42, and in a manner that one edge of the photomask terminates in the surface of the trench 41 at a laterally central portion thereof so as not to cover the field region 6. Thereafter, the surface of the resist 9 is exposed to light through the photomask under a suitable exposure condition. The exposed resist 9 is subjected to development to have a portion thereof over the field region 6 removed. The light exposure should also satisfy the condition that while part of the resist 9 in the vicinity of its surface not covered with the photomask and exposed to light is removed by development, portions of the resists 9 within the trenches 41, 42 are not exposed to light to such a sufficient extent that the same portions still remain unremoved even after the development, with the aid of a large thickness of portions of the resist 9 lying between the bottoms of the trenches 41, 42 and the surface of the resist 9, as shown in FIG. 1(d).

On this occasion, if the width of the trench 41 is set at 4 microns, the mask alignment operation has only to satisfy mask aligning tolerances of +2 microns. Such tolerance values can be easily attained with the present photolithography technique. Incidentally, in practice, mask aligning tolerances of +1 micron or less can be achieved with the present photolithography technique, and the width of the trench 41 can therefore be set at a value of the order of 2 microns minimum, if required.

The portion of the oxidation-resistant masking layer 8 over the field region 6 is removed by etching after the removal of the resist 9 from the field region 6. Then, the remainder of the resist 9 over the regions other than the field region 6 is removed by solvent. A polycrystalline silicon film 10 is deposited over the whole surface of the silicon body in a manner burying the trenches 41, 42 [FIG. 1(e)]. To ensure required planarity of the silicon body surface, the thickness of the polycrystalline silicon film above the silicon body surface should preferably be more than half of the width of the trenches 41, 42.

Figure 1E:
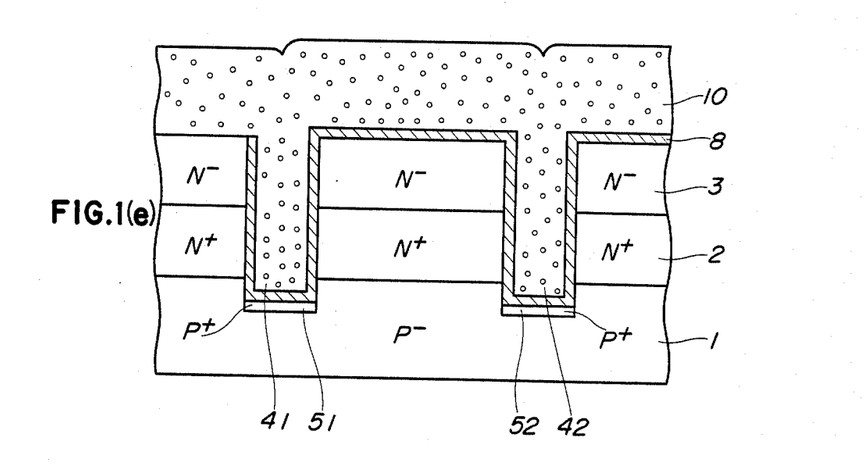

The polycrystalline silicon 10 is continuously etched back in a conventional manner until the surface level of the polycrystalline silicon 10 assumes a suitable value such that the distance between the surface of the epitaxial layer 3 at the device-forming regions 71, 72 and the etched surface of the polycrystalline silicon film 10 is not more than half of the depth of the trenches 41, 42. Desirably, the surface level of the polycrystalline silicon 10 should be within a range of from 0.7 to 1 micron from the silicon body surface.

Figure 1F:
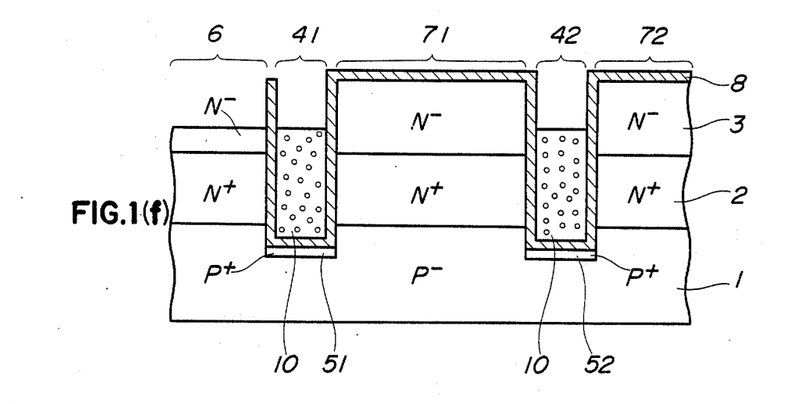

At the device-forming regions 71, 72, the etching is interrupted when the silicon oxide film forming the uppermost layer of the masking layer 8 becomes exposed to the outside, whereas at the field region 6 where the masing layer 8 has been removed as noted before, the silicon body, i.e. the epitaxial layer 3 per se is etched so that its etched surface becomes nearly flush with the surface of the polycrystalline silicon 10 within the trenches 41, 42 [FIG. 1(f)].

Following this etching, a thermal oxidation step is executed to convert part of the silicon body at the field region 6 not covered with the oxidation-resistant masking layer 8 as well as part of the polycrystalline silicon 10 within the trenches 41, 42, to thick oxide films 11 having a thickness of 1.5–2 microns. The thick oxide films 11 have an increased volume with respect to the volume of the original silicon 10, 3 (2) such that its surface level is substantially identical with the surface level of the silicon body, thus obtaining a flat surface over the silicon body [FIG. 1(g)].

Figure 1G:
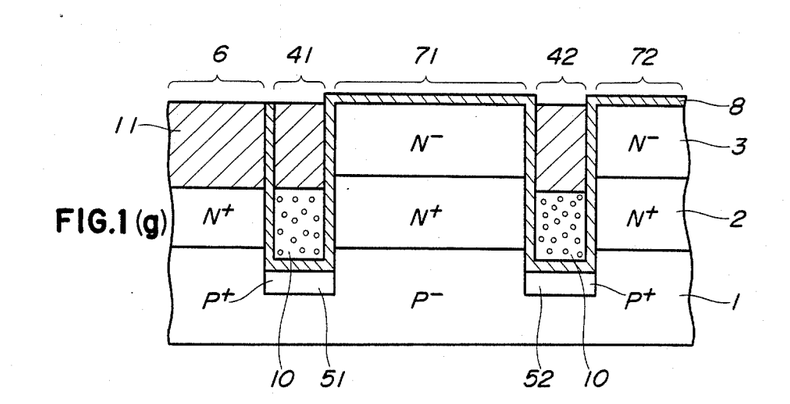

Thereafter, portions of the oxidation-resistant masking layer 8 are removed from the device-forming regions 71, 72 in a conventional manner, followed by formation of device elements on these regions in a conventional manner to complete integrated semiconductor circuit devices.

As described above, according to the method of the invention, a flat surface free of bird's beak and bird's head can be obtained, and it is possible to flatten the surfaces of the small width isolation regions 41, 42 and the large width field region 6 at the same time by simple steps. To be specific, since the polycrystalline silicon film 10 is deposited over the generally even surface of the silicon wherein the surfaces of the field region 6 and the device-forming regions 71, 72 are nearly flush with each other, the surface of the polycrystalline silicon film 10 is accordingly flat. Further, since the epitaxial layer 3 of the silicon body which is formed of monocrystalline silicon and the polycrystalline silicon 10 have nearly the same etch rate, the field region 6 and the polycrystalline silicon 10 within the trenches 41, 42 are etched back to the same level almost at the same time. Still further, the monocrystalline silicon forming the epitaxial layer 3 of the field region 6 and the polycrystalline silicon 10 filled in the trenches 41, 42 have nearly the same rate of volume increase by thermal growth. Thus, after the thermal oxidation step, the silicon body has a flat surface over its entire area. Therefore, the method of the invention can dispense with the use of a special flattening mask as required by the Trench Isolation.

In addition, according to the invention, the uniform width of the trenches 41, 42 results in an equal etched polycrystalline silicon level within the trenches 41, 42, further enhancing the surface planarity of the silicon body.

The isolation trenches 41, 42 can be formed with a small width within a short time by means of RIE with ease, making it possible to omit the use of a mask for formation of buried layers as well as a mask for formation of isolation trenches, as distinct from Improved Local Oxidation Process.

Besides, the P+ channel stop layers 51, 52 and the N+ buried layers 2 separated by the isolation trenches 41, 42 are completely isolated by means of the isolation trenches 41, 42 extending through the buried layers 2 into the silicon substrate 1 such that lateral spreading of the buried layers 2 beyond the respective device-forming regions 71, 72 is prevented by the isolation trenches, thus minimizing the parasitic capacitance between the device-forming regions and the silicon substrate. Moreover, the isolation trenches 41, 42 also prevent lateral spreading of the P+ layers 51, 52 into the adjacent N− epitaxial layers 2, thus eliminating leakage between the P+ layers 51, 52 and the base region, as well as a reduction in the breakdown voltage of the transistor.

Furthermore, the presence of the thick silicon oxide films 11 over the field region 6 and in the isolation trenches 41, 42 minimizes the electrostatic capacitance between the conductors formed on the surface of the silicon body and the silicon substrate.

FIG. 2(a)-FIG. 2(d) show a second embodiment of the method of the invention. In these figures, elements and parts corresponding to those in FIG. 1(a)-FIG. 1(g) are designated by identical reference characters, and detailed description of them is omitted.

According to the second embodiment, following the execution of steps substantially identical with the steps described with reference to FIG. 1(a)-FIG. 1(c), steps shown in FIG. 2(a)-FIG. 2(d) are executed.

Figure 2A:
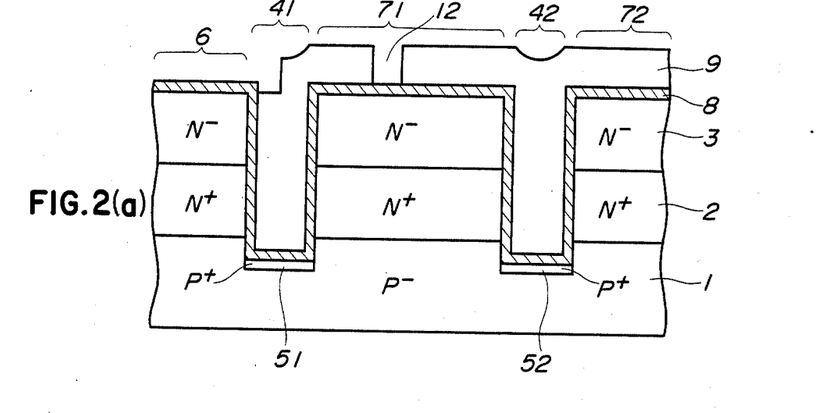
FIG. 2(a)–FIG. 2(d) are schematic sectional views of a semiconductor body in different steps according to a second embodiment of the method of the invention.
Figure 2B:
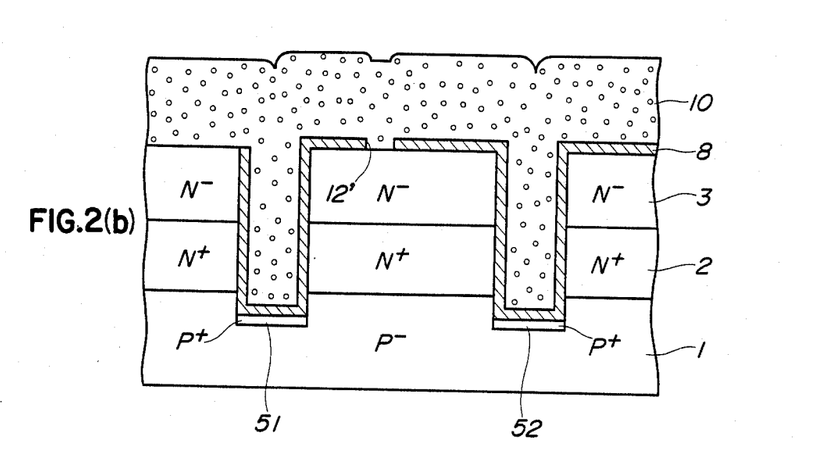
Figure 2C:
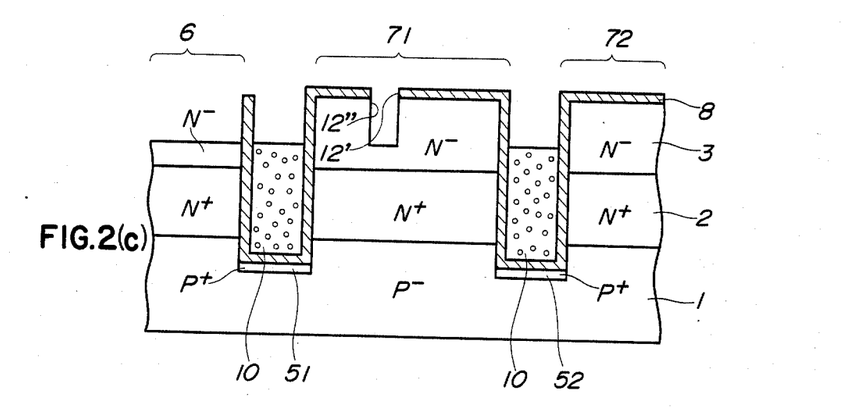
Figure 2D:
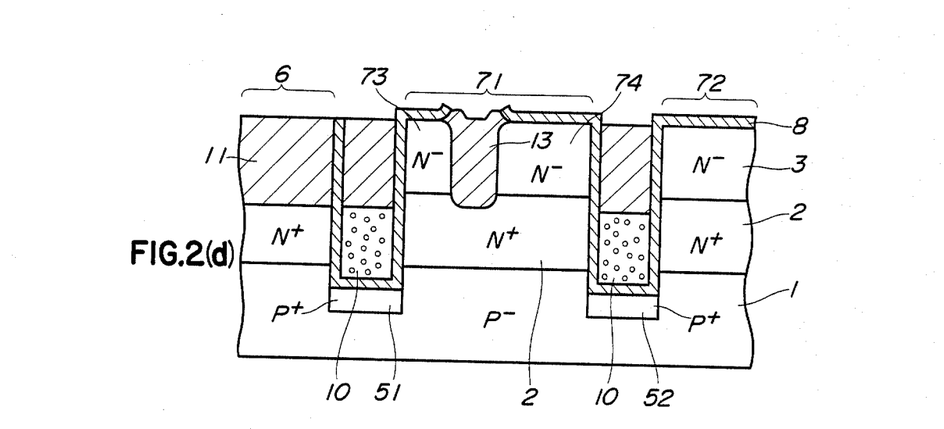

In the step of FIG. 2(a), by using a photomask, not shown, having an aperture at a location corresponding to a predetermined location on the device-forming region 71, light exposure, development and exposed photoresist removal are effected in similar manners to those described with reference to FIG. 1(d) directed to the first embodiment, to form a spatial region 12 in the device-forming region 71. Then, etching is effected to remove part of the oxidation-resistant masking layer 8 from the field region 6 and also from a portion of the device-forming region 71 to form an opening 12' therein. The remainder of the resist 9 is removed, followed by depositing a polycrystalline silicon film 10 over the silicon body surface so as to bury the isolation trenches 41, 42 as shown in FIG. 2(b) corresponding to FIG. 1(e), and etching of the polycrystalline silicon film 10 as shown in FIG. 2(c) corresponding to FIG. 1(f). On this occasion, besides part of the silicon body (the epitaxial layer 3) at the field region 6, part of the silicon body (the epitaxial layer 3) at the device-forming region 71 is also etched through the opening 12' to form a trench 12" of a suitable depth. Following this, thermal oxidation is effected to form a silicon oxide film 13 within the above trench 12" and simultaneously a silicon oxide film 11 at the field region 6, as shown in FIG. 2(d). The silicon oxide film 13 vertically penetrates the epitaxial layer 3 into the buried layer 2, thereby dividing the device-forming region 71 into two regions 73, 74 having the buried layer 2 located right under them.

Therefore, according to the second embodiment, not only the same results as those obtained by the first embodiment stated before can be obtained, but also the two subdivided regions 73, 74 can be used as the collector contact region and the base region, respectively, thereby being suitable for formation of a bipolar transistor. To form the above trench 12", it suffices to directly utilize the photomask for removal of the oxidation-resistant masking layer 8 from the field region 6 merely by adding an alteration to the pattern thereon so as to form the opening 12', and accordingly no further photomask needs to be employed.

Figure 3A:
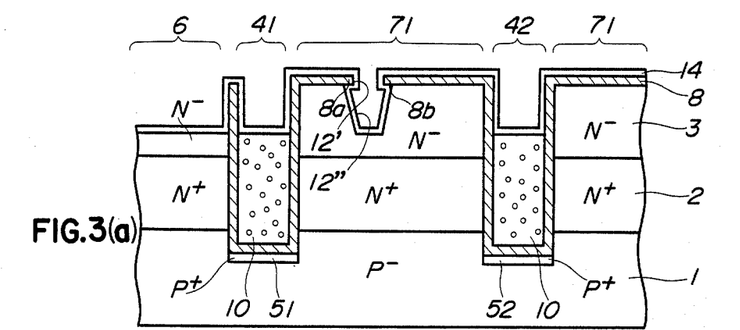
FIG. 3(a)–FIG. 3(c) are schematic sectional views of a semiconductor body in different steps according to a third embodiment of the method of the invention.
Figure 3B:
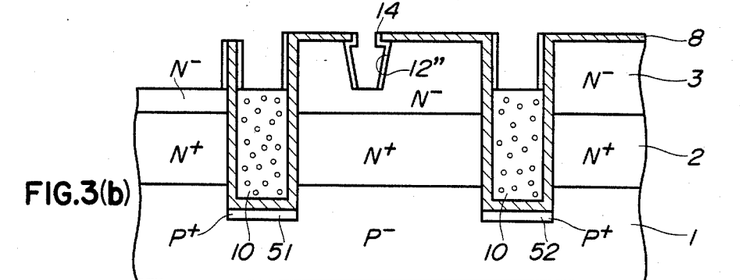
Figure 3C:
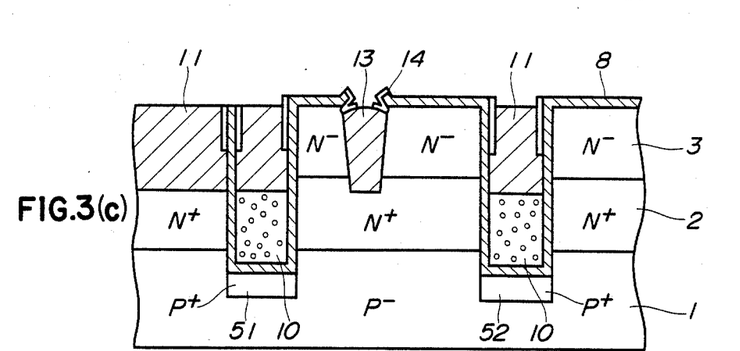

FIG. 3(a)-FIG. 3(c) show a third embodiment of the invention. In these figures, elements and parts corresponding to those in FIG. 1(a)-FIG. 1(g) and FIG. 2(a)-FIG. 2(d) are designated by identical reference characters, and detailed description of them is omitted.

According to the third embodiment, first executed are steps substantially identical with the steps of FIG. 1(a)-FIG. 1(e) and FIG. 2(a)-FIG. 2(b) previously described. During etching of the polycrystalline silicon film 10 following the execution of the step of FIG. 2(b), a portion of the epitaxial layer 3 in the device-forming region 71 is etched back, too, which corresponds to an opening 12' formed in the oxidation-resistant masking layer 8 formed by using photomask having a predetermined pattern as used in the aforedescribed second embodiment, to form a trench 12" of a suitable depth in the epitaxial layer 3. On this occasion, the side walls of the trench 12" should preferably be tapered by the use of an etching method which also causes a suitable amount of lateral etching, so that the oxidation-resistant masking layer 8 has overhangs 8a and 8b lying in an upper end of the trench 12", so as to obtain a desired flat surface as stated hereinafter [FIG. 3(a)].

Then, the silicon body and the polycrystalline silicon 10 have their exposed surfaces subjected to thermal oxidation to form thereon a silicon oxide film, not shown, having a thickness of from 200 to 1000 Angstroms, and then a silicon nitride film of a thickness of from 500 to 1000 Angstroms is formed by CVD over the silicon oxide film and the oxidation-resistant masking layer 8, to thus form a second oxidation masking layer 14 [FIG. 3(a)]. As shown in FIG. 3(a), the second oxidation-resistant masking layer 14 extends along the overhangs 8a, 8b of the oxidation-resistant masking layer 8 as well as the walls of the trench 12" to cover them.

Thereafter, the second oxidation-resistant masking layer 14 is etched by RIE such that portions of the masking layer 14 at the bottom surfaces of the trenches 41, 42, 12" are removed, while portions of same at the side walls of these trenches remain unremoved [FIG. 3(b)]. The silicon body is then subjected to thermal oxidation to cause formation of thick oxide films 11, 13 at the field region 6 and within the trenches 41, 42, and 12", thereby obtaining a flat surface over the whole area of the silicon body [FIG. 3(c)].

According to the third embodiment, the same results can be obtained as those obtained with the first and second embodiments previously stated. Further, while according to the second embodiment there can be a formation of bird's beak and/or bird's head on the thick oxide film 13 dividing the device-forming region 71 into the subdivided regions 73, 74, which spoil the planarity of the silicon body surface, according to the third embodiment upward bulging of the thick oxide film 13 from the trench 12" is suppressed by the second masking layer 14 remaining at the side walls of the trench 12" [FIG. 3(c)], to thus further enhance the surface planarity. In addition, according to the third embodiment, the newly added steps in addition to the steps of the first and second embodiments, that is, the thermal oxidation for formation of the silicon oxide film and the CVD for formation of the silicon nitride film, are executed in a self-aligned manner, thereby requiring no additional photomask.

Although the foregoing embodiments are applied to bipolar integrated semiconductor circuit devices, the invention is not limited to the bipolar type, but it may of course be applied to MOS type integrated semiconductor circuit devices.

What is claimed is:

1. A method of forming a structure adapted for formation of integrated circuit devices on a semiconductor body, comprising the steps of:
   (1) forming in one surface of said semiconductor body a plurality of trenches of a given width extending substantially vertically with respect to said one surface;
   (2) depositing an oxidation-resistant masking layer over said one surface of said semiconductor body and the walls of said trenches;
   (3) removing portions of said oxidation-resistant masking layer corresponding to predetermined portions of said one surface of said semiconductor body;
   (4) depositing a polycrystalline semiconductor material over said one surface of said semiconductor body to bury said trenches;
   (5) continuously removing in part said polycrystalline semiconductor material and portions of said semiconductor body corresponding to said predetermined portions of said one surface thereof, from which said portions of said oxidation-resistant masking layer have been removed, until said polycrystalline semiconductor material and said semiconductor body have a predetermined surface level lower than said one surface of said semiconductor body; and
   (6) oxidizing at least in part the remainder of said polycrystalline semiconductor material and the remainder of said portions of said semiconductor body corresponding to said predetermined portions of said one surface thereof, to cause same to increase in volume until they have substantially the same surface level with said one surface of said semiconductor body.

2. A method as claimed in claim 1, wherein said step (3) comprises depositing a photoresist over said one surface of said semiconductor body to bury said trenches, exposing to light selected portions of said photoresist in a manner such that portions of said photoresist on said predetermined portions of said one surface of said semiconductor body are removed by development, whereas portions of said photoresist within said trenches remain unremoved even by said development, removing said exposed selected portions of said photoresist, and etching said portions of said oxidation-resistant masking layer to remove same from said predetermined portions of said one surface of said semiconductor body.

3. A method as claimed in claim 1, wherein said step (1) comprises reactively ion etching said one surface of said semiconductor body to form said trenches therein.

4. A method as claimed in claim 1, wherein said step (2) comprises forming said oxidation-resistant masking layer over said one surface of said semiconductor body and the walls of said trenches, by chemical vapor deposition.

5. A method as claimed in claim 1, wherein in said step (5), said polycrystalline semiconductor material and said semiconductor body are removed in part by etching.

6. A method as claimed in claim 5, wherein said polycrystalline semiconductor material is formed of polycrystalline silicon, and at least part of said semiconductor body to be removed by etching is formed of monocrystalline silicon.

7. A method as claimed in claim 1, wherein said structure has a plurality of regions formed in said semiconductor body, said trenches being isolation trenches isolating said regions.

8. A method as claimed in claim 7, wherein said regions comprise element-forming regions and field regions, said field regions being formed in said predetermined portions of said one surface of said semiconductor body.

9. A method as claimed in claim 8, wherein said semiconductor body comprises a substrate of a predetermined conductivity type, a buried layer of the opposite conductivity type formed by diffusion over a substantially entire surface of said substrate, and an epitaxial layer of said opposite conductivity type formed over said buried layer, said isolation trenches extending through said epitaxial layer and said buried layer into said subtrate, said element-forming regions being surrounded between said isolation trenches.

10. A method as claimed in claim 9, wherein said predetermined portions of said one surface of said semiconductor body include a portion located within at least one of said device, said step (5) including removing in part said semiconductor body to form a second trench in said portion of said at least one of said device-forming regions, said step (6) including thermally oxidizing said second trench to form therein oxide extending through said epitaxial layer to divide same into two regions both having said buried layer underlying them.

11. A method as claimed in claimed 9, including the step of forming a channel stop layer under the bottom of each of said isolation trenches.

12. A method of forming a structure adapted for formation of integrated circuit devices on a semiconductor body, comprising the steps of:
   (1) forming in one surface of said semiconductor body a plurality of trenches of a given width extending substantially vertically with respect to said one surface;
   (2) depositing a first oxidation-resistant masking layer over said one surface of said semiconductor body and the walls of said trenches;
   (3) removing portions of said first oxidation-resistant masking layer corresponding to predetermined portions of said one surface of said semiconductor body;
   (4) depositing a polycrystalline semiconductor material over said one surface of said semiconductor body to bury said trenches;
   (5) continuously removing in part said polycrystalline semiconductor material and portions of said semiconductor body corresponding to said predetermined portions of said one surface thereof, from which said portions of said oxidation-resistant masking layer have been removed, until said polycrystalline semiconductor material and said semiconductor body have a predetermined surface level lower than said one surface of said semiconductor body;
   (6) depositing a second oxidation-resistant masking layer over said semiconductor body along said one surface thereof and predetermined surface portions thereof lower in level than said one surface in a manner superimposed upon said first oxidation-resistant masking layer;

(7) removing portions of said second oxidation-resistant masking layer on a predetermined level lower than said one surface of said semiconductor body; and (8) oxidizing at least in part the remainder of said polycrystalline semiconductor material and the remainder of said portions of said semiconductor body corresponding to said predetermined portions of said one surface thereof and said predetermined lower surface portions thereof, to cause same to increase in volume until they have substantially the same surface level with said one surface of said semiconductor body.

13. A method as claimed in claim 12, wherein said step (5) comprises removing in part by etching said polycrystalline semiconductor material and said semiconductor body, said etching being so effected as to configurate said second trench in said semiconductor body such that said first oxidation-resistant masking layer has overhangs lying in an end of said second trench opening in said one surface of said semiconductor body, said step (6) comprising depositing said second oxidation-resistant masking layer in a manner covering said overhangs of said first masking layer and the walls of said second trench.

14. A method as claimed in claim 13, wherein said semiconductor body comprises a substrate of a predetermined conductivity type, a buried layer of the opposite conductivity type formed by diffusion over a substantially entire surface of said substrate, and an epitaxial layer of said opposite conductivity type formed over said buried layer, said second trench being thermally increased in volume to penetrate said epitaxial layer during said step (8) to divide said epitaxial layer into two regions both having said buried layer underlying them.

15. A method as claimed in claim 12, wherein said step (2) and said step (3) comprise forming respective ones of said oxidation-resistant masking layers by chemical vapor deposition.

16. A method as claimed in claim 12, wherein said step (7) comprises removing said portions of said second oxidation-resistant masking layer on said predetermined level lower than said one surface of said semiconductor body, by reactive ion etching.

* * * * *

UNITED STATES PATENT AND TRADEMARK OFFICE
CERTIFICATE OF CORRECTION

PATENT NO. : 4,582,565
DATED : April 15, 1986
INVENTOR(S) : Akira KAWAKATSU

It is certified that error appears in the above-identified patent and that said Letters Patent is hereby corrected as shown below:

In the heading of the Patent, on the front page, under the heading "Assignee" data should read as follows:

--Oki Electric Industry Co., Ltd.--

Signed and Sealed this

Ninth Day of September 1986

[SEAL]

Attest:

DONALD J. QUIGG

Attesting Officer

Commissioner of Patents and Trademarks